United States Patent [19]

Allred et al.

[11] Patent Number: 4,792,501
[45] Date of Patent: Dec. 20, 1988

[54] MULTILAYERED ARTICLE INCLUDING CRYSTALLIZATION INHIBITING LAYER AND METHOD FOR FABRICATING SAME

[75] Inventors: David D. Allred, Troy; Jesus Gonzalez-Hernandez, Rochester; On Van Nguyen, Sterling Heights, all of Mich.

[73] Assignee: Energy Conversion Devices, Inc., Troy, Mich.

[21] Appl. No.: 135,772

[22] Filed: Dec. 21, 1987

Related U.S. Application Data

[63] Continuation of Ser. No. 734,293, May 15, 1985, abandoned.

[51] Int. Cl.⁴ ............................ B32B 9/00; B32B 19/00
[52] U.S. Cl. .................................. 428/699; 428/333; 428/688; 428/689; 428/698; 428/701; 428/702; 428/704; 428/913

[58] Field of Search ............... 428/704, 333, 469, 701, 428/689, 688, 698, 699, 702, 913

[56] References Cited

U.S. PATENT DOCUMENTS 4,357,616 11/1982 Terao et al. ................... 346/135.1
4,461,807 7/1984 Mori et al. ........................ 428/469

*Primary Examiner*—Sharon A. Gibson
*Attorney, Agent, or Firm*—Marvin S. Siskind; Richard M. Goldman; Kenneth M. Massaroni

[57] ABSTRACT

A multilayered article includes at least one periodically repeating set including a layer of amorphous crystallizable material and a layer of crystallization inhibiting material in generally superposed relationship. The layer of crystallizable material has its crystallization temperature raised by the presence of the inhibiting layer. Also disclosed are methods for the fabrication of the multilayered article.

15 Claims, 1 Drawing Sheet

MULTILAYERED ARTICLE INCLUDING CRYSTALLIZATION INHIBITING LAYER AND METHOD FOR FABRICATING SAME

This application is a continuation of application Ser. No. 734,293 filed on May 15, 1985, now abandoned.

FIELD OF THE INVENTION

The instant invention relates in general to phase change materials, and in particular to multilayered structures characterized by an increased crystallization temperature for one of the component layers thereof. Also included within the scope of the instant invention are methods for increasing the crystallization temperature of a material.

BACKGROUND OF THE INVENTION

Materials may be readily characterized in terms of the physical properties which they manifest. Among these properties are reflectivity of various wavelengths of light, electrical conductivity, thermal conductivity, density, specific heat and so forth. Materials may also be characterized in terms of the arrangement of the component atoms thereof. In crystalline materials, atoms are deterministically arranged in highly ordered, repetitive patterns. Amorphous materials in contradistinction, do not exhibit such a high degree of long range order. The term "amorphous" as used herein, is defined to include alloys or materials exhibiting long range disorder, although said alloys or materials may exhibit short or intermediate range order or even contain crystalline inclusions.

The distinction between the amorphous and the crystalline state is an important one for a wide variety of materials insofar as many of the physical properties manifested by those materials will depend upon whether they are in the crystalline or the amorphous state. For example, in many materials electrical conductivity will vary by orders of magnitude for the crystalline and amorphous forms thereof. Likewise, optical properties such as reflectivity, optical absorption and index of refraction may also exhibit significant changes depending upon the degree of crystallinity or lack thereof.

While some materials are constrained to exist solely in the amorphous or solely in the crystalline form, there are a wide variety of materials which can exist in either state. In those instances where the energy barrier separating the two states is of an appropriate value, the material may be readily switched from the amorphous to the crystalline state and vice versa by the input of energy. In some cases this switching may be carried out reversibly, whereas in other cases the reverse path is strongly disfavored, and the material remains in the state in which it is set.

As mentioned previously, the transition between the amorphous state and the crystalline state can produce a diversity of changes in the readily detectable physical properties of a material. Such changes can form the basis for many useful devices and systems. For example, as disclosed in U.S. Pat. No. 3,530,441 of S. R. Ovshinsky entitled "Method And Apparatus For Storing And Retrieving Information", which patent is assigned to the assignee of the instant invention, and the disclosure of which is incorporated herein by reference; both optically and electrically addressable data storage systems may be based upon changes in detectable characteristics exhibited by a material as it is switched between the amorphous and the crystalline state. Similarly, electrical switches, relays and the like may be fabricated utilizing phase change effects.

In light of the significance of the amorphous to crystalline phase change, it would be desirable to be able to control the energy threshold for the onset of this change so as to better exploit the effects thereof. Heretofore, control of the onset of crystallization of a given material has been accomplished by alloying or doping that material with other elements, or otherwise chemically modifying it so as to change its crystallization threshold. While these approaches have generally allowed for a wide degree of control of physical properties of many systems, such control always involved the addition of extraneous substances into the material having its crystallization temperature modified. In some cases the addition of extraneous material could be tolerated, however in other cases such additions changed other properties of the system. Obviously, it would be desirable to have a method for controlling the onset of crystallization temperature in a material, said control being one which does not necessitate the introduction of any extraneous materials into the material.

Control of the onset of crystallization can have significant use in optical and electronic data storage systems such as those discussed previously. Furthermore, control of the onset of crystallization also has use in the more general field of materials research. Also, by controlling the onset of crystallization, the amorphous phase can be "locked in" for a significantly greater temperature range, thereby making it possible to better utilize the unique properties of amorphous materials such as catalytic properties, magnetic properties, optical properties, corrosion resistance and so forth, for electronic devices, surface coatings and the like.

According to the principles of the instant invention, which principles will be described in greater detail hereinbelow, a crystallizable amorphous material may have its crystallization temperature significantly increased without the addition of extraneous material thereto. The instant invention also provides for the fabrication of a multilayered structure in which at least one layer thereof has its crystallization temperature significantly increased. Such structures have great utility as optically addressable data storage devices.

These and other aspects, advantages and utilities of the instant invention will be further described and detailed in the brief description of the invention, the drawings and the detailed description which follow.

BRIEF DESCRIPTION OF THE INVENTION

There is disclosed herein a multilayered article which includes a layer of amorphous, crystallizable material, said material characterized by a given temperature for the onset of crystallization in the bulk. The article comprises a layer of said amorphous crystallizable material of less than 200 Angstroms thickness and a layer of crystallization inhibiting material on a first surface of the layer of crystallizable material. Because of the presence of the inhibiting layer the crystallization temperature for the layer of amorphous crystallizable material is increased over the bulk crystallization temperature. In other preferred embodiments of the instant invention, a second layer of crystallization inhibiting material is disposed generally coextensive with a second surface of the amorphous crystallizable layer.

The instant invention also includes a multilayered article comprising a plurality of layers of crystallizable material and a plurality of layers of crystallization inhibiting material, said layers disposed in alternating, generally coextensive relationship. The plurality of inhibiting layers may be of similar composition, or they may be of two or more different compositions. Likewise, the plurality of layers of crystallizable material may all be of substantially similar composition or they may be of two or more different compositions.

In some cases the layer of crystallization inhibiting material may be a relatively thick, rigid member which is also capable of providing a supporting substrate for the multilayered article.

The crystallizable layer may be fabricated from a material which exhibits a change in a detectable characteristic upon crystallization. In some cases this change may be a change in optical properties, whereby the multilayered article is adapted for use as an optical data storage medium.

Among the materials which may be utilized for the fabrication of the crystallizable layers are: tellurium, selenium, germanium, arsenic, silicon, tellurium based materials, selenium based materials, germanium based materials, arsenic based materials, silicon based materials, and combinations thereof. The crystallization inhibiting layer may be formed from a material chosen from the group consisting essentially of germanium based materials, silicon based materials, boron based materials, silicon oxides, silicon nitrides, germanium oxides, germanium nitrides, silicate glasses, borosilicate glasses and combinations thereof.

Also disclosed herein is a method of raising the crystallization temperature of an amorphous crystallizable material, which method includes the steps of providing a layer of the amorphous crystallizable material of less than 200 Angstroms thickness and providing a layer of crystallization inhibiting material disposed on a first surface of the layer of crystallizable material. One or more of the layers may be deposited by a vacuum deposition technique such as sputtering, evaporation, glow discharge deposition, molecular beam epitaxy, ion plating and ion milling.

Also disclosed herein is a method of manufacturing a optical data storage medium. The method includes the steps of providing a layer of amorphous crystallizable material of less than 200 Angstroms thickness and providing a layer of crystallization inhibiting material disposed on a first surface of the layer of crystallizable material. In some cases the step of providing a layer of crystallization inhibiting material comprises the further step of providing a relatively thick, rigid member having at least one surface thereof formed of a crystallization inhibiting material, whereby said relatively thick member provides support for, and inhibits the crystallization of the layer of crystallizable material. The step of providing amorphous crystallizable material comprises the further step of providing a layer of amorphous material which exhibits a change in optical properties upon the crystallization thereof.

DETAILED DESCRIPTION OF THE DRAWINGS

Figure 1A:
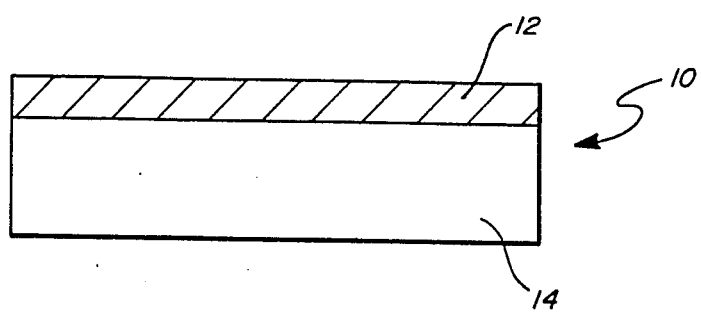
FIG. 1A is a cross sectional view of a multilayered article structured in accord with the principles of the instant invention and comprised of a layer of crystallizable material and a layer of crystallization inhibiting material.

Referring now to FIG. 1A, there is shown in cross section a multilayered structure 10 configured in accord with the principles of the instant invention. The structure includes a layer of an amorphous crystallizable material 12 and a layer of a crystallization inhibiting material 14. The amorphous crystallizable material 12 is a material which is capable of existing in either the crystalline or amorphous state and which may be switched from one state to another by the application of the proper form and amount of energy thereto. In accord with the principles of the instant invention, the temperature at which the amorphous form of the material forming the layer 12 is switched to the crystalline state is substantially elevated. While there are no stringent limitations on the dimension of the crystallizable layer, it has been generally found that layer thicknesses in excess of 200 angstroms, the inhibition of crystallization is less than for thinner layers. Accordingly, in the practice of the instant invention, layers of less than 200 angstroms thickness are preferred.

It should be noted that heretofore conventional thought in the disciplines of amorphous thin film materials ran counter the principles of the instant invention. The general observation was that a thin layer of amorphous material has its crystallization temperature lowered when it is in contact with a layer of another material; see, for example, the paper of Herd, et al, entitled: "Metal Contact Induced Crystallization In Films Of Amorphous Silicon And Germanium." Journal of Non-Crystalline Solids 7 (1972) pp. 309–327. Consequently, our finding that the crystallization of layers of amorphous materials can be retarded by the presence of an inhibiting layer is novel and unexpected.

There are a wide variety of materials capable of existing in either the amorphous or crystalline state; accordingly, the instant invention may be practiced with any such material. By way of illustration and not limitation, some of the materials which may be employed for the fabrication of the crystallizable layer 12 include: tellurium, selenium, germanium, arsenic, and silicon as well as alloys and other materials containing the aforementioned elements. It should be noted that as used herein the term "element containing material" and its equivalents are meant to refer to the pure form of the element as well as all compounds, mixtures, alloys, and molecular species which include the specified element.

Disposed in immediate contact with substantially all of the amorphous crystallizable layer 12 is a crystallization inhibiting layer 14. It is a notable feature of the instant invention that the presence of this layer 14 substantially raises the temperature at which the amorphous crystallizable layer 12 changes from the amorphous to the crystalline state. The crystallization inhibiting layer 14 may be formed from a wide variety of materials, the main criteria being that the material forming the layer 14 have a crystallization temperature (if amorphous) which is higher than the crystallization temperature of the material in the crystallizable layer 12; or, have a crystalline phase transition temperature (if crystalline) greater than the crystallization temperature of the crystallizable layer 12. Some of the materials having utility for the fabrication of crystallization inhibiting layers 14 include by way of illustration and not limitation: germanium based materials, silicon based materials and boron based materials. Among the materials having particular utility are: silicon oxides, silicon nitrides, germanium oxides, germanium nitrides, silicate glasses, borosilcate glasses and combinations of the foregoing. There is generally no thickness limitation for the inhibiting layer 14, the only requirement being that it form a relatively continuous layer in contact with the crystallizable layer 12. The thickness of the inhibiting layer is not critical to the instant invention. Any continuous layer of inhibiting material will exert its effect upon the crystallizable material. It has been determined experimentally that inhibition of crystallization may be obtained with layers as thin as 5 Angstroms. In some cases, and as specifically illustrated in FIG. 1A, the crystallization inhibiting layer 14 may be a relatively thick member which also functions as a substrate for supporting and rigidifying the entire structure 10.

It has been found that in structures configured according to the principles of the instant invention, significant elevation of the threshold temperature for crystallization of materials is obtained. For example, sputtered or evaporated-amorphous germanium normally crystallizes when maintained at 400° C. for approximately one hour. However, when the same layer of amorphous germanium is in contact with a layer of a crystallization inhibiting material such as silicon nitride, it may be maintained at temperatures of up to 600° C. for one hour without crystallization. These and other results will be disclosed in greater detail hereinbelow. While the exact mechanism of the inhibition is not fully understood, it has been postulated that the inhibiting layer 14 exerts a "micromechanical" effect which inhibits crystallization. This micromechanical effect may result from a constraining of the constituent atoms of the amorphous matrix of the crystallizable layer 12, by the atoms of the inhibiting layer 14. This constraint prevents the atomic rearrangements necessary to effect crystallization. The micromechanical effect may occur through interactions between the atoms of the layers, and in this manner serves to increase the energy barrier separating the amorphous and the crystalline states. It has been noted that retardation of crystallization is not dependent on any alloying or mixing of the components of the two layers. Raman Spectroscopy has demonstrated that a distinct interface is obtained between the two layers and no difusion or intermixing occurs until crystallization temperature is reached, if it occurs at all.

Figure 1B:
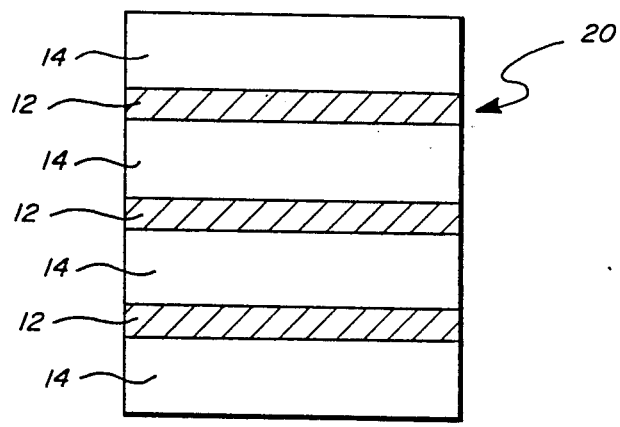
FIG. 1B is a cross sectional view of another multilayered article structured in accord with the principles of the instant invention, said article comprised of a plurality of layers of crystallizable material and a plurality of layers of crystallization inhibiting material disposed in alternating, generally coextensive relationship; and, FIG. 2 is a schematic representation of an apparatus as adapted for the preparation of multilayered articles in accord with the principles of the instant invention.

Referring now to FIG. 1B there is shown another multilayered structure 20 configured in accord with the instant invention. The multilayered structure 20 is generally similar in composition and dimensions to the structure 10 depicted with reference to FIG. 1A, except that it includes a plurality of amorphous crystallizable layers 12 and a plurality of crystallization inhibiting layers 14 disposed in alternating, generally coextensive relationship. The layers 12, 14 are generally similar to those described with reference to FIG. 1A. It should be noted however, that the multilayered structure 20 of FIG. 1B may be fabricated with layers of crystallizable material 12 which are all of substantially similar composition, or with layers of differing composition. Similarly the layers of crystallization inhibiting material 14 may be of similar or diverse composition.

The component layers of the multilayered structure of the instant invention may be prepared by any one of the many techniques available to those skilled in the art, the instant invention not being limited by the method or manner employed for preparation of the layers. Among some of the available techniques are vacuum deposition techniques such as: sputtering, glow discharge deposition, evaporation, molecular beam epitaxy, ion plating, low pressure chemical vapor deposition and variants thereupon. Non-vacuum techniques such as electroplating, atmospheric pressure chemical vapor deposition, plasma spraying and the like may be employed. The only requirement for the apparatus and/or technique employed in the practice of the instant invention is that it be capable of providing uniform layers of material with distinct interfaces therebetween.

Figure 2:
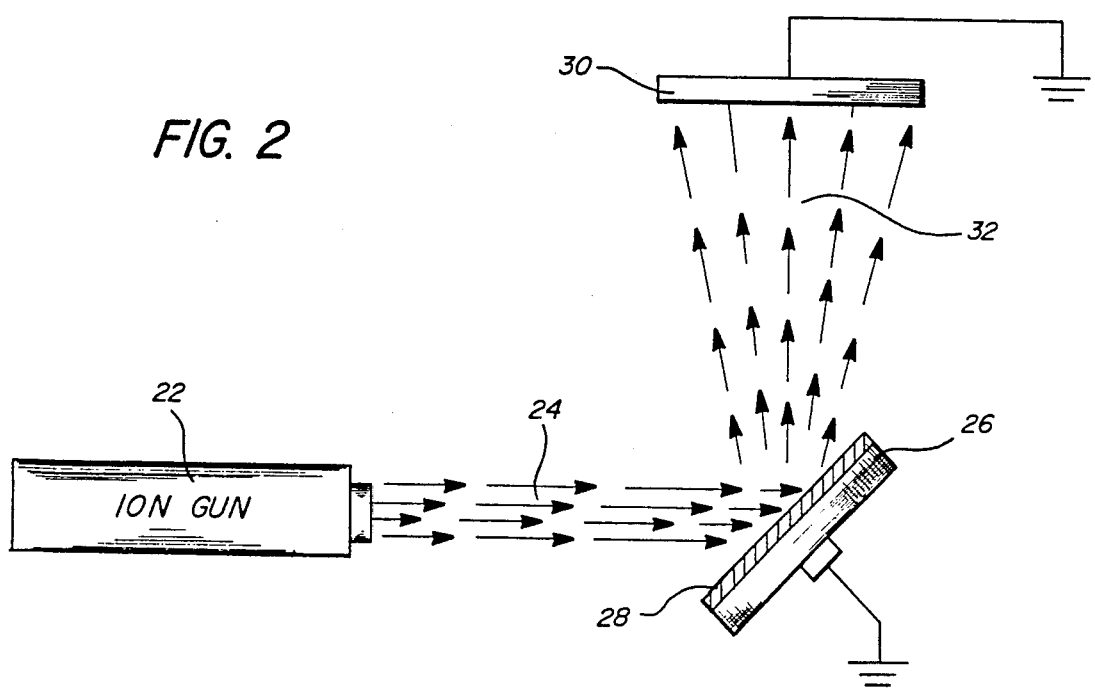

Referring now to FIG. 2, there is shown one particular apparatus adapted for fabrication of multilayered structures generally similar to those depicted with reference to FIG. 1A and 1B. Although as mentioned, many methods and apparatus may be utilized for the fabrication of the structures, the apparatus of FIG. 2 is a modified ion-milling apparatus. As depicted, the apparatus includes a source of ions such as an ion gun 22. Ion guns are well known to those skilled in the art and generally comprise an ion generating portion wherein atoms or molecules of a working medium, typically an inert gas such as argon, are ionized; the gun further includes an accelerating section in which the ionized material is kinetically energized and projected outward. Depicted in the Figure is a beam of ions 24, emanating from the ion gun 22.

Also included in the apparatus of FIG. 2 is a target 26 disposed so as to intercept the ion beam 24. The target 26 is generally maintained at ground potential and has at least a deposition surface 28 thereupon comprised of the material to be deposited, i.e., either the crystallizable material or the crystallization inhibiting material. The target 26 is disposed so as to present the deposition surface 28 in the path of the ion beam 24. When the deposition material 28 is thus disposed it will be struck by the ion beam 24 and a stream 32 of particles of the deposition material will be ejected from the target 26.

An electrically grounded substrate member 30 is disposed so as to intercept the stream of ejected particles 32 and accumulate a deposit thereof thereupon. Although not depicted, the deposition apparatus of FIG. 2 is enclosed within an evacuable chamber so as to allow operation of the process at pressures below atmospheric. Also, although not depicted, the target 26 and the substrate 30 may each have heating and/or cooling means associated therewith to maintain proper temperatures during the deposition process. Heating or cooling may be accomplished by any method well known to those skilled in the art of vacuum deposition.

In operation, a substrate 30 is loaded into the apparatus. The substrate forms a support member for the multilayered structure. In some cases the substrate may itself be the crystallization inhibiting layer in which case the crystallizable material will be deposited directly thereupon. In other instances a layer of crystallization inhibiting material will be deposited upon the substrate. Positioned in the apparatus is a target 26 having a deposition surface 28 formed of the first material to be deposited upon the substrate. For example, if a crystallization inhibiting layer of silicon nitride is to be the first deposited layer, the target 26 will have a surface 28 formed of bulk silicon nitride material. The vacuum system is activated to reduce the pressure within the apparatus to a working range, typically $10^{-4}$ torr. A stream of working gas such as argon is flowed into the ion gun 22 for production of an energetic beam 24 of argon ions. The ions impact upon the silicon nitride surface of the target 26 and emit a shower of silicon and nitrogen containing species in a stream 32 which strikes and condenses upon the substrate 30.

It has been found that at a working pressure of $10^{-4}$ torr and an ion beam power of 2-4 mw/cm$^{-2}$ deposition rates of 2-10 Angstroms per second are achieved utilizing a process similar to that depicted in FIG. 2. In order to deposit a second layer upon the substrate, the target 26 is replaced with one having a deposition surface 28, formed of the second material to be deposited. It is desirable in many cases to employ a deposition apparatus having a plurality target mounted upon a rotatable fixture; in this manner, targets may be readily changed without a necessity for breaking vacuum.

EXAMPLE 1

In this example the effect of a layer of silicon nitride in retarding the crystallization of a layer of germanium was assessed. According to the method a series of 5 samples were prepared, each consisting of 10 crystallization inhibiting layers disposed in alternating relationship with 50 Angstroms thick amorphous germanium layers. The five samples differed only in the thickness of their inhibiting layers, and were all fabricated on vitreous quartz substrates. The layers were of silicon nitride in the various samples were of 5, 15, 50 and 150 Angstroms thickness. Samples were prepared by the ion-milling deposition technique described with reference to FIG. 2. For comparison purposes a fifth sample consisting solely of ten 50 Angstrom thick layers of germanium was prepared on a vitreous quartz substrate. Raman analysis of the germanium layers indicated that there was no nitrogen present therein, i.e. distinct interfaces were obtained between the germanium and the nitride.

The efficacy of the nitride layer in preventing crystallization was assessed by isochronally annealing the samples at progressively higher temperatures. Annealing in all cases was carried out for one hour after which time the samples were inspected for signs of crystallization. It was found that the unprotected germanium layer was completely crystallized after one hour of annealing at 400° C., while the germanium in the remaining layered samples was still amorphous. The layered samples were next annealed at 500° C. for one hour. Inspection of the samples revealed no signs of crystallization.

The five samples were next heated for one hour at 600° C. At the end of this time it was found that the sample having a 5 Angstrom thick silicon nitride layers was completely crystallized, while the remaining samples showed progressively less crystallization as the thickness of the nitride layer increased. The sample having a 15 Angstrom thick protective layers was approximately 20% crystalline, the sample having the 50 Angstrom thick layers was approximately 20% crystalline and the sample having the 150 Angstrom thick protective layers was less than 20% crystalline.

EXAMPLE 2

In this example, the effect of a layer of silicon in retarding the crystallization of a layer of germanium was assessed. Evaporated or sputtered silicon crystallizes at approximately 550° C. and, as previously described evaporated or sputtered germanium crystallizes at approximately 400° C. For this experimental series two groups of multilayered samples of germanium and silicon were prepared; one by sputtering and the other by evaporation. In each case the layers of the two materials were of approximately similar thickness, said thickness varying from 8 to 200 Angstroms. Samples comprising between 10 and 100 pairs of layers were assessed.

As in the preceeding experiment, evaluation of the samples was carried out by isochronally annealing them. It was found for all of the samples that the crystallization temperature of the germanium was increased to just below 600° C. The samples were studied during various stages of the annealing process by utilizing Raman Spectroscopy and it was found that very little interdiffusion of the layers occured prior to the crystallization. However, at a temperature just below the crystallization temperature of the germanium Raman Spectroscopy showed an increased in Si-Ge bonds, and at crystallization there was extensive diffusion at the silicon-germanium interface.

EXAMPLE 3

In this example, the effect of a bulk layer of silicon dioxide in retarding the crystallization of evaporated germanium was assessed. Germanium layers of 50, 100, 150 and 200 Angstroms thickness were evaporated under ultra high vacuum conditions, i.e. approximately $10^{-10}$ Torr.

Evaluation of the thus prepared two layered samples was carried out by isochronal annealing. The first annealing run was made at 400° C. for one hour (i.e, the approximate bulk crystallization temperature for evaporated or sputtered germanium). It was noted that the 200 Angstrom thick sample began to crystallize under these conditions; less than 5% crystallites were present in the sample. The thinner samples all remained in the amorphous state. The samples were next annealed at 460° C. for one hour. The 200 Angstrom thick sample crystallized completely under these conditions and the 150 Angstroms thick sample began to crystallize. The 100 Angstrom and the 50 Angstrom thick samples remained amorphous. The samples were next annealed at 500° C. for one hour. The 150 Angstrom thick sample was completely crystalline. The 100 Angstrom thick sample was approximately 20% crystalline while the 50 Angstrom thick sample remained amorphous.

EXAMPLE 4

In this example, the effect of a layer of silicon nitride in retarding the crystallization of a layer of silicon was assessed. The various layers for this experimental series were prepared by radio frequency energized glow discharge deposition, as is well known to those skilled in the art. The silicon layers were deposited from a gas mixture which included silane and accordingly are amorphous silicon:hydrogen alloy layers. The nitride layers were deposited from a gas mixture which incuded silane and ammonia and accordingly are amorphous silicon:hydrogen:nitrogen alloy layers. It has been found that bulk amorphous silicon:hydrogen material prepared under these conditions crystallizes at approximately 650° C.

A first sample was prepared which comprised ten layers of amorphous silicon:hydrogen material of approximately 20 Angstroms and 10 layers of amorphous silicon:hydrogen:nitrogen alloy material also of approximately 20 Angstroms, disposed in alternating relationship so as to yield a 20 layer structure. The thus prepared sample was annealed at 900° C. for one hour. Analysis via Raman Spectroscopy showed that approximately 3% of the silicon:hydrogen alloy material had crystallized.

A second sample was prepared which was generally similar to the first sample except that the silicon:hydrogen alloy layers were 40 Angstroms thick. This sample was annealed at 800° C. for one hour and it was found that the silicon:hydrogen alloy layers were approximately 20% crystalline.

It can be seen that the instant invention provides for the retardation of the crystallization of a layer of material to temperatures significantly above the normal bulk crystallization temperature thereof. The instant invention accordingly has significant utility in the fabrication of optical memory media wherein data is stored by changing the phase of a portion of a layer of material. By utilizing the method of the instant invention the crystallization transition temperature of the material may be changed without producing any change in the bulk property thereof. This ability is useful in cases where it is desired to utilize an unstable material as a storage medium. In the fabrication of optical memories, as well as electrically addressable storage media, it is frequently desirable to employ an unstable material as the phase change storage layer insofar as an unstable material will give a quick switching or setting time; however, unstable materials generally have a low crystallization temperature and may be inadvertantly set or switched during handling. By employing the instant invention, it is possible to maintain the quick setting characteristic of the unstable material while significantly raising the threshold temperature for crystallization thereof.

The instant invention also has utility in the manufacture of light absorbing layers for photothermal energy conversion. It has been found that some amorphous materials have high optical absorption coefficients making them particularly suited as absorbing members for converting light to heat. However, heating can crystallize such layers, and thereby change their optical properties. Accordingly, the temperature range over which they may be employed is restricted. The addition of alloying agents can retard crystallization, however such agents also change the optical absorption of the material. By employing the principles disclosed herein, the crystallization temperature of the amorphous layer may be raised without effecting any change in the optical properties thereof.

Note that while the foregoing examples described a multilayered structure in which all of the component layers thereof were generally coextensive, the scope of the instant invention is not so limited. In many instances, it may be desirable to have only sections of a given surface crystallize at a higher temperature. This sectional crystallization inhibiting process is also intended to be included herein.

The foregoing discussion, drawings, description and experiments are merely meant to be illustrative of the instant invention and not be limitation upon the practice thereof. It is the following claims, including all equivalents, which define the scope of the instant invention.

We claim:

1. A multilayered article including a layer of amorphous, crystallizable material, said material characterized by a given temperature for the onset of crystallization in the bulk thereof, said article comprising:
    a layer of said amorphous crystallizable material of less than 200 Angstroms thickness formed from a material chosen from the group consisting of: tellurium, selenium, germanium, arsenic, silicon, tellurium based materials, selenium based materials, germanium based materials, arsenic based materials, silicon based materials, or combinations thereof; and,
    a layer of crystallization inhibiting material on a first surface of said layer of amorphous crystallizable material, said inhibiting material chosen from the group consisting of: germanium based materials, silicon based materials, boron based materials, silicon oxides, silicon nitrides, germanium oxides, germanium nitrides, silicate glasses, borosilicate glasses, or combinations thereof;
    the interface between said layer of crystallizable material and said layer of crystallization inhibiting material being distinct; whereby the crystallization temperature for the layer of amorphous crystallizable material is increased over the bulk crystallization temperature.

2. A multilayered article as in claim 1, wherein the crystallization inhibiting material is generally coextensive with the crystallizable material and further including a second layer of crystallization inhibiting material generally coextensive with a second surface of said amorphous crystallizable layer.

3. A multilayered article as in claim 1, further comprising: a plurality of said layers of amorphous, crystallizable material and a plurality of said layers of crystallization inhibiting material, said layers disposed in alternating, generally coextensive relationship.

4. A multilayered article as in claim 3, wherein said plurality of layers of crystallization inhibiting material are of substantially similar composition.

5. A multilayered article as in claim 3, wherein said plurality of layers of crystallization inhibiting material are of at least two differing compositions.

6. A multilayered article as in claim 3, wherein said plurality of layers of amorphous crystallizable material are of substantially similar composition.

7. A multilayered article as in claim 3, wherein said plurality of layers of amorphous crystallizable material are of at least two different compositions.

8. A multilayered article as in claim 1, wherein said layer of crystallization inhibiting material is a relatively thick, rigid member capable of providing support to said article.

9. A multilayered article as in claim 1, wherein said amorphous, crystallizable layer is fabricated from a material which exhibits a change in a detectable characteristic upon crystallization.

10. A multilayered article as in claim 1, wherein said amorphous, crystallizable layer is fabricated from a material which exhibits a change in optical properties upon crystallization, whereby said article is adapted for use as an optical data storage medium.

11. A multilayered article as in claim 1, wherein said crystallization inhibiting material is an amorphous material having a crystallization temperature which is greater than the crystallization temperature of the amorphous, crystallizable material.

12. A multilayered article as in claim 1, wherein said crystallization inhibiting material is a crystalline material having a crystalline transition temperature which is greater than the crystallization temperature of the amorphous crystallizable material.

13. A multilayered article as in claim 1, wherein said amorphous, crystallizable material is capable of being reversible switched between the amorphous state and the crystalline state.

14. A multilayered article as in claim 1, wherein said layer of amorphous crystallizable material is a layer of amorphous germanium of less than 150 Angstroms thickness; and said layer of crystallization inhibiting material is a layer of silicon nitride of at least 50 Angstroms thickness.

15. A multilayered article as in claim 1, wherein said amorphous crystallizable material is material having a high optical absorption coefficient, and said multilayered article is adapted for use in a photothermal energy conversion system.

* * * * *